(12) United States Patent
Kitching et al.

(10) Patent No.: US 8,334,690 B2
(45) Date of Patent: Dec. 18, 2012

(54) ATOMIC MAGNETOMETER AND METHOD OF SENSING MAGNETIC FIELDS

(75) Inventors: John Kitching, Boulder, CO (US); Svenja Knappe, Boulder, CO (US); Jan Preusser, Boulder, CO (US); Vladislav Gerginov, Braunschweig (DE)

(73) Assignee: The United States of America as represented by the Secretary of Commerce, The National Institute of Standards and Technology, Washington, DC (US)

( * ) Notice: Subject to any disclaimer, the term of this patent is extended or adjusted under 35 U.S.C. 154(b) by 637 days.

(21) Appl. No.: 12/537,922

(22) Filed: Aug. 7, 2009

(65) Prior Publication Data

US 2011/0031969 A1 Feb. 10, 2011

(51) Int. Cl.
*G01V 3/00* (2006.01)

(52) U.S. Cl. ........ 324/301; 324/304; 324/305; 324/307; 324/321

(58) Field of Classification Search .......... 324/300–322, 324/464.4, 244.1; 600/407–435; 382/128–131
See application file for complete search history.

(56) References Cited

U.S. PATENT DOCUMENTS

| | | | |
|---|---|---|---|
| 4,700,135 A | 10/1987 | Hoenig | |
| 4,947,480 A | 8/1990 | Lewis | |
| 6,472,869 B1 * | 10/2002 | Upschulte et al. | 324/304 |
| 7,038,450 B2 * | 5/2006 | Romalis et al. | 324/304 |
| 7,127,146 B2 * | 10/2006 | Schmidt et al. | 385/129 |
| 7,130,675 B2 | 10/2006 | Ewing et al. | |
| 7,145,333 B2 * | 12/2006 | Romalis et al. | 324/304 |
| 7,149,396 B2 * | 12/2006 | Schmidt et al. | 385/131 |
| 7,197,352 B2 | 3/2007 | Gott et al. | |
| 7,323,941 B1 | 1/2008 | Happer et al. | |
| 7,345,475 B2 | 3/2008 | Takeuchi et al. | |
| 7,468,630 B2 | 12/2008 | Inamdar et al. | |
| 7,494,598 B2 | 2/2009 | Youngner et al. | |
| 7,521,928 B2 * | 4/2009 | Romalis et al. | 324/304 |
| 7,652,473 B2 * | 1/2010 | Kawabata | 324/304 |
| 7,872,473 B2 * | 1/2011 | Kitching et al. | 324/305 |
| 7,994,783 B2 * | 8/2011 | Ledbetter et al. | 324/306 |
| 8,212,556 B1 * | 7/2012 | Schwindt et al. | 324/304 |
| 2004/0140799 A1 * | 7/2004 | Romalis et al. | 324/301 |
| 2005/0007118 A1 * | 1/2005 | Kitching et al. | 324/464 |
| 2005/0206377 A1 * | 9/2005 | Romalis et al. | 324/301 |
| 2006/0008227 A1 * | 1/2006 | Schmidt et al. | 385/129 |
| 2007/0167723 A1 | 7/2007 | Park et al. | |
| 2007/0252593 A1 | 11/2007 | Takeuchi et al. | |
| 2008/0106261 A1 * | 5/2008 | Romalis et al. | 324/304 |
| 2008/0296257 A1 | 12/2008 | Youngner et al. | |
| 2009/0001979 A1 * | 1/2009 | Kawabata | 324/244.1 |
| 2009/0039881 A1 * | 2/2009 | Kitching et al. | 324/304 |
| 2009/0256561 A1 * | 10/2009 | Ledbetter et al. | 324/305 |
| 2011/0031969 A1 * | 2/2011 | Kitching et al. | 324/304 |

* cited by examiner

*Primary Examiner* — Melissa Koval
*Assistant Examiner* — Tiffany Fetzner
(74) *Attorney, Agent, or Firm* — Steve Witters; Witters & Associates

(57) ABSTRACT

A magnetometer and method of use is presently disclosed. The magnetometer has at least one sensor void of extraneous metallic components, electrical contacts and electrically conducting pathways. The sensor contains an active material vapor, such as an alkali vapor, that alters at least one measurable parameter of light passing therethrough, when in a magnetic field. The sensor may have an absorptive material configured to absorb laser light and thereby activate or heat the active material vapor.

20 Claims, 6 Drawing Sheets

ATOMIC MAGNETOMETER AND METHOD OF SENSING MAGNETIC FIELDS

STATEMENT REGARDING FEDERALLY SPONSORED RESEARCH OR DEVELOPMENT

This work is funded by the National Institute of Standards and Technology under the U.S. Department of Commerce.

FIELD OF THE INVENTION

This invention relates to magnetometers, and more particularly to a laser-pumped magnetometer and method of use.

BACKGROUND

It is often desirable to sense or detect magnetic fields such as magnetic fields generated from underground objects or within a living organism. The detection of magnetic fields may aid in geophysical mapping, underground deposit detection, navigation, and physiological mapping. For example, the detection of biomagnetic signals, in the form of weak magnetic signals, within the human body may enable the temporally and spatially resolved mapping of current dipoles within the human body. The two main biological sources of magnetic fields that have been sensed or detected are the human heart and brain. One advantage of detecting magnetic signals rather than electrical signals outside the body is that no electrodes have to be in contact with the patient's body directly. The magnetic signal may also have a richer content of information than the electrical counterpart.

Functional brain studies using magnetoencephalography (MEG) have been a growing medical research field over the past years. The spatial and temporal magnetic field distribution at different locations around the head may be detected after visual or auditory stimulation of the patient, for example. This method may allow for detection with improved signal to noise, since the signal may be averaged over many stimulation cycles.

Recently, the MEG has become a valuable tool for the clinical diagnostics in areas such as epilepsy and brain monitoring. Even though the magnetic signal may be detected in many places around the patients head, determining the position of origin of the magnetic field has remained a challenge. The placement of the electrodes or sensors and the use of mathematical algorithms have provided some estimations of the origin of the magnetic fields, but the quality of such estimations remains in question.

Many of the brain studies in the prior art have been performed with superconducting quantum interface devices (SQUIDs). SQUIDs measure the magnetic flux through a pickup coil that has to be kept at cryogenic temperatures. Maintaining these cryogenic temperatures may be complex, expensive and may require a substance (cryogen) that occurs in limited quantities on earth.

Large scale atomic magnetometers have a sensitivity comparable to the sensitivity of SQUIDs, reaching sensitivities below 1 fT/√Hz. For example, large scale atomic magnetometers have shown the ability to measure magnetic fields of the human brain after auditory stimulation. This ability has been shown by placing a single large vapor cell proximate to a patient's head and selecting different "channels" by different laser beams probing different volumes within the cell. An advantage of the atomic magnetometers over SQUIDs are that no cryogenics are needed.

Large-scale atomic magnetometers, in addition to being large, expensive and difficult to operate, may have electrical conducting elements in the immediate vicinity of the sensor head in order to transmit signals and power to the sensor. Electrically conducting elements are known to cause fluctuating magnetic fields, which can disturb the magnetic environment around the sample being monitored. Additionally, electrical connections between the sensor head and the instrumentation box can cause difficulty when the sensor is operated in a high-voltage environment. Further, conventional atomic magnetometers are typically operated by driving the atoms at the sample location with an oscillating magnetic field. This oscillating field may extend into the region around the sensor head and may create interference with other sensors in the immediate vicinity or with the sample being monitored.

What is needed is an atomic magnetometer having magnetic sensors and methods for detecting magnetic fields that improve upon the deficiencies of the prior art.

SUMMARY

In one aspect of the present invention, a magnetometer comprising at least one sensor void of extraneous metallic components, electrical contacts and electrically conducting pathways is provided. The at least one sensor comprises an alkali material contained within an alkali vapor cell. The alkali vapor cell is configured to contain the alkali material and vapor of the alkali material and comprises at least one translucent or transparent wall configured to allow laser light to pass therethrough. The alkali vapor cell also comprises at least one wall configured to reflect, refract or transmit at least a portion of laser light passing through the at least one translucent or transparent wall to a detector. The alkali vapor cell comprises a material configured to interact with laser light and thereby evolve a sufficient amount of alkali vapor, within the alkali vapor cell, upon activation with laser light. The interaction of the laser light with the material may take the form of heating, in which laser light is absorbed by the material thereby heating the material and hence the alkali metal. It may also take the form of light-induced desorption of alkali atoms from the interior surface of the material. The sufficient amount of alkali vapor is suitable for altering at least one measurable parameter of laser light, being reflected, refracted or transmitted with the at least one reflective, refractive or transmissive wall, in response to a magnetic field. The magnetometer also comprises at least one laser configured to direct laser light into the alkali vapor cell through the at least one translucent or transparent wall. A detector is configured to receive laser light emitted from the at least one laser, after passing the laser light through the alkali vapor and reflecting, refracting or transmitting the laser light with the at least one reflective, refractive or transmissive wall.

In another aspect of the present invention, a method for detecting a magnetic field is provided. The method comprises the steps of: a) directing a first beam of laser light to a magnetic sensor; b) heating an alkali material, contained within the magnetic sensor, to a desired temperature with the first beam of laser light; c) vaporizing at least a portion of the alkali material within the magnetic sensor; d) containing the alkali material vapor within the magnetic sensor; e) passing a second beam of laser light through the alkali material vapor; f) receiving the second beam, with a detector, after the second beam of laser light has passed through the alkali material vapor; and g) detecting, with the detector, at least one measurable parameter of the second beam of laser light that is altered upon the second beam of laser light passing through the alkali material vapor when the magnetic sensor is in the presence of a magnetic field.

In yet another aspect of the present invention, a magnetometer comprising at least one sensor head void of extraneous metallic components, electrical contacts and electrically conducting pathways, is provided. The at least one sensor head comprises an alkali material, an alkali vapor cell containing the alkali material and vapor of the alkali material. The alkali vapor cell comprises a material configured to heat the alkali material contained therein a sufficient amount to vaporize a portion of the alkali material upon the application of laser light onto or through an outer surface thereof. An enclosure configured to substantially enclose and insulate the alkali vapor cell is provided. The enclosure comprises an alkali vapor cell support, comprising a low thermal conductive material, supporting the alkali vapor cell within the enclosure wherein a void space is between the outer surface of the alkali vapor cell and the enclosure. The magnetometer further comprises a first optic fiber having a first end in light communication with the alkali vapor cell and a laser in light communication with a second end of the first optic fiber. A second optic fiber is provided having a first end in light communication with the alkali vapor cell and a second end in light communication with an optical detector. The optical detector is configured detect at least one measurable parameter of laser light that is altered upon passing through the vapor cell in the presence of a magnetic field.

BRIEF DESCRIPTIONS OF THE DRAWINGS

The following figures, which are idealized, are not to scale and are intended to be merely illustrative and non-limiting;

DETAILED DESCRIPTION

Figure 1:
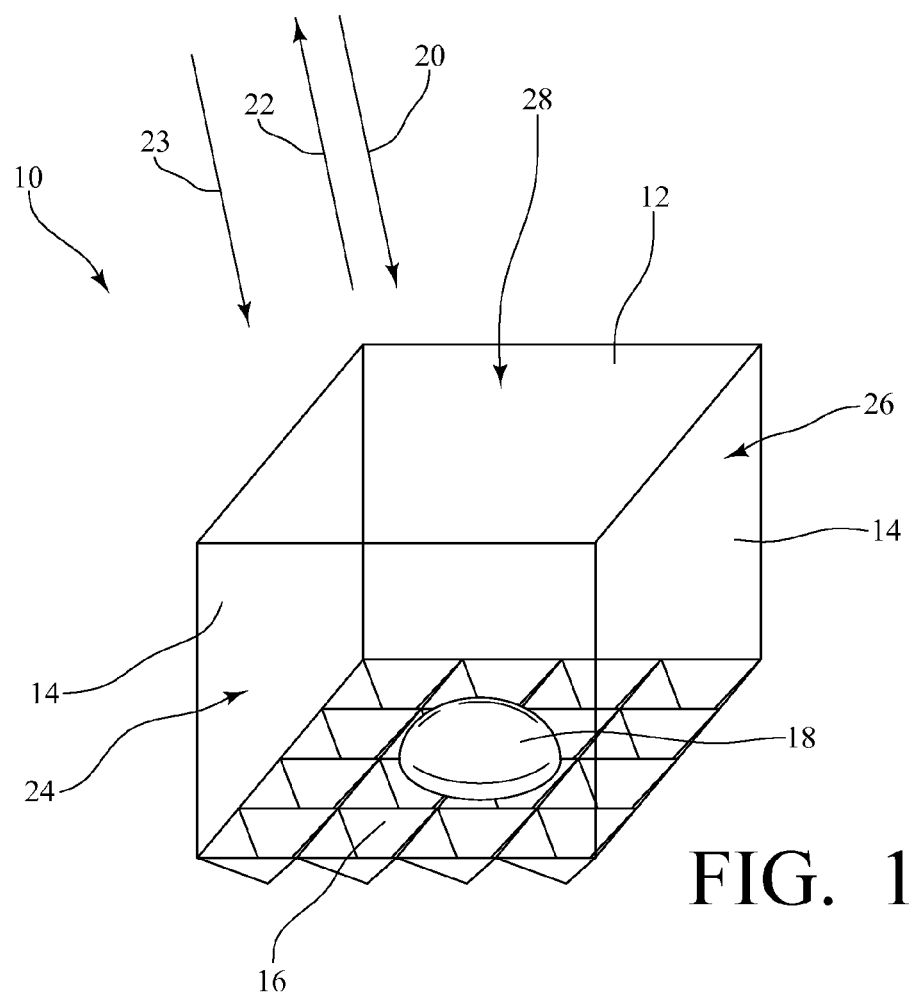
FIG. 1 is an illustration of an atomic magnetometer sensor having a reflective surface configured to operate in free space.

In at least one embodiment of the present invention there is disclosed a fiber-coupled microelectromechanical systems (MEMS) magnetometer array based on a spin-exchange relaxation-free (SERF) technique operation in a single-beam configuration. In this technique, the spins of alkali vapor atoms, such as $^{87}$Rb atoms, inside a MEMS vapor cell are aligned through optical pumping with circularly polarized light at about 795 nm, for example, in the z direction. In the absence of an ambient magnetic field in the transverse direction (xy plane), the highly polarized atomic vapor may be nearly transparent to the resonant light. If a transverse magnetic field is present, the atoms start to precess around this field and absorb more light. The amount of light absorbed depends on the strength of the magnetic field. The transverse field may be measured in this way with a high sensitivity.

The magnetometer may be sensitive to transverse magnetic fields only. The magnetometer is a vector sensor and the two transverse components of the ambient field may be measured separately. In order to distinguish between the x and y transverse components, two or more oscillating fields may be applied in orthogonal directions at different frequencies. These oscillations may be picked up on the transmitted light and are proportional to the magnitudes of the transverse fields (i.e., x and y directions). The magnetometer may not detect magnetic fields in the z direction. If the total magnetic field exceeds a certain value, however, the sensitivity of the magnetometer may decrease. This decrease in sensitivity may be due to spin-exchange collisions that may cause the resonance line to broaden, if the Larmor frequency is of order of the atomic collision rate. Larmor precession is the precession of the magnetic moments of electrons, atomic nuclei, and atoms about an external magnetic field. The angular momentum vector precesses about the external field axis with an angular frequency is known as the Larmor frequency. Therefore, the ambient field may need to be shielded or compensated for, in order not to exceed this value.

The sensitivity of the magnetometer may be determined by the resonance line width, the resonance signal amplitude, and the noise. In many atomic magnetometers, the resonance line width may be limited by the lifetime of the spin coherence induced in the atoms. Collisions of the atoms with other atoms and cell walls may play a major role in this limitation. Buffer gases, such as inert gases or molecules (e.g. neon) that have a low spin-destruction cross-section may be added into the cell volume to reduce wall collision effects. Buffer gas pressure and composition may be selected for increased performance in the specific application. A major contribution to the line width may be caused by collisions between the alkali atoms themselves. The broadening mechanism from such spin-exchange collisions may be suppressed though, if the Larmor frequency is smaller than the collision rate. Operating the magnetometer in the so-called SERF regime, e.g., at high alkali densities and low magnetic fields, may narrow the line width substantially and improve the magnetometer sensitivity. The signal amplitude depends mainly on the pumping light intensity and the cell temperature. These two parameters may be optimized and actively stabilized to ensure operation under optimal conditions for a given cell size. Major noise sources may include the photon shot noise and laser noise. Active laser stabilizations may be included to minimize these effects.

In one aspect of the present disclosure, a chip-scale atomic magnetometer (CSAM) is provided. The CSAM has a configuration of all-optical microfabricated magnetometer that allows the sensing and measurement of magnetic fields, for example, emanating from the brain and other parts of the body. An all-optical remote sensor head is disclosed using a micro-fabricated vapor cell containing an alkali species, such as $^{87}$Rb, enclosed in an etched silicon structure and suspended with low thermal conductivity supports for thermal isolation. Heating of the cell may be achieved by optical absorption of light of a laser diode delivered to the vapor cell via an optical fiber or through free space. A single-mode laser (such as a vertical-cavity surface-emitting laser or VCSEL or DFB laser) may be used to probe the magnetically sensitive transition of the rubidium vapor. In at least one embodiment disclosed herein, one or more laser beams may be provided for pumping and probing. By transmitting both the heating and excitation light to and from the cell using optical fibers or through free space, the magnetometer sensor is free of any metal parts or electrical currents that could produce magnetic noise. The performance of the magnetometer having sensors void of extraneous metallic components, electrical contacts and electrically conducting pathways may provide a mode of operation to reach a sensitivity better that 1 pT√Hz, which corresponds to the sensitivity required to detect biomagnetic signals. This mode of operation may only be limited by the photon shot noise of the detector. With an improved detector, a desired sensitivity may be achieved with embodiments of the magnetometer described herein. This may provide a means for magnetoencephalography and remote magnetic resonance imaging.

Advantages of embodiments of the sensor head disclosed herein may include having all signals to and from the sensor head optical and no metallic components on the sensor head. Additional advantages may include having no electrical contacts on the sensor head or electrically conducting paths between the sensor head and an instrumentation box. Further advantages may include having no magnetic fields applied at sensor location and providing sensor heads easily adapted to sensor array applications. Other advantages may include providing sensor heads with Sub-pT sensitivities, all-optical heating of the vapor cell, all-optical temperature stabilization of the vapor cell, and all-optical interrogation of the atomic resonances. Additionally, self-alignment of components may be provided by the use of etched silicon or other material for which the etched structures are precisely defined by lithographic patterning.

A CSAM is described in at least one embodiment of the present invention. Aspects of the CSAM may be fiber-coupled CSAMs which may provide a means for sensing and measurement of magnetic fields emanating from the brain and other parts of the body. Other aspects of the present disclosure provide CSAMs that may be used in free space, providing a means to detect magnetic fields without tethering to a laser or detector.

Disclosed herein, is an atomic magnetometer with a flexible array of small MEMS atomic sensors with desired magnetic field sensitivities. For example, the sensitivity may be about 50 fT per root Hz, 1 fT per root Hz, or even lower, and bandwidths of 100 Hz, or more. The sensor heads may have a volume of less than 1 cm$^3$ and may be placed into an arbitrary geometry with independent orientations and positions for each sensor head. The magnetic sensors may be connected to a supply box by optical fibers only and may not contain any magnetic parts or electrical connections. The CSAMs may be vector sensors that are sensitive to magnetic fields in two orthogonal directions. They may also be scalar sensors that are sensitive to the magnitude of the local magnetic field, independent of orientation. For optimum performance, the total magnetic field at the position of the sensor head may not exceed a value determined by the alkali collision rate, typically about 100 nT for cell temperatures in the range of about 150° C.

The sensors heads may be in the form of a cube and may contain the actual magnetometer sensor with an active volume of about 1 mm$^3$. The remaining volume of the sensor head may be filled with thermal insulation, mechanical suspension, and optical components. The optical fibers connecting the cubes or sensor heads to the supply unit may have a length of about 5 meters and supply the light for pumping of the atomic vapor, collecting the output signal after probing the atoms, and supplying the light for heating the atomic vapor. No electrical or magnetic components may be present inside the cubes.

For example, small MEMS atomic magnetometers may have total volumes of the physics package less than 10 mm.

The physics package may include a vapor cell, thermal insulation, and optics. These sensors may have active volumes around 1 mm$^3$. Embodiments of the sensor heads configured to operate in free space may also have a total volume of about 1 mm$^3$. Small MEMS atomic magnetometers may be total field sensors that may operate in a wide variety of ambient fields. Even though the sensitivity of small MEMS atomic magnetometers may be limited by collisions of alkali atoms inside the vapor cell, this limitation may be overcome by a technique called SERF magnetometry. However, this technique may require heating and maintaining an elevated temperature of the vapor cell. Yet, aspects of the instant disclosure provide a means for heating the vapor cell and the monitoring the temperature of the vapor cell without electrically conductive components and the flow of electricity within or proximate the sensor, which may create a magnetic field and thus introduce noise to the sensor.

Wafer-level fabrication of magnetometer sensor heads disclosed herein may provide for inexpensive, light, low-power arrays of such sensors. These sensors may be easier to maintain and operate than sensors of the prior art. MEMS atomic magnetometer sensor heads disclosed herein may provide magnetic sensitivities below 100 fT/√Hz, which may provide a means for using MEMS alkali magnetometers with volumes of a few cubic millimeters for measuring biomagnetic signals. Embodiments of the all-optical magnetometer may be extended for use in other microfabricated atomic sensors.

FIG. 1 shows an embodiment of an atomic magnetometer sensor that may operate in free space. Atomic magnetometer sensor 10 has transparent or translucent top wall 12 and side walls 14 extending from peripheral edges thereof. One or more of side walls 14 may also be transparent or translucent. In one embodiment, top wall 12 and side walls 14 are comprised of the same material. The bottom wall 16 comprises an upper reflective surface. In the embodiment shown here, bottom wall 16 comprises a plurality of corner reflectors configured to reflect incoming laser light along path 20, back toward the source, along laser path 22. However, it is to be understood that bottom wall 16 may have a flat, curved, or other surface configured to reflect incoming laser light along path 20 in any desired directional path 22. Typically, light path 22 leads to a laser light detector, not shown.

Top wall 12, side walls 14, and bottom wall 16 are sealed together at their edges to form an enclosure having an enclosed volume 28. Within enclosed volume 28 is an alkali material 18, shown here in solid form. A buffer gas 24 may also be contained within enclosed volume 28. The top wall 12, side walls 14 and bottom wall 16 may also be coated with a thin layer of material to reduce the effects of wall interactions on the alkali orientation. Alkali material 18 may be heated with a separate laser along light path 23 or may be heated with the laser light directed along light path 20. Upon heating alkali material 18, a significant portion or most all of alkali material 18 may vaporize to form alkali vapor 26 within enclosed volume 28.

After the formation of alkali vapor 26 within enclosed volume 28, atomic magnetometer sensor 10 is ready to detect magnetic fields. However, it is to be understood that alkali vapor 26 may have a sufficient partial pressure within enclosed volume 28 without heating. Thus, no heating of the alkali material 18 may be needed. Laser light is directed into atomic magnetometer sensor 10 along laser light path 20 wherein the light passes through alkali vapor 26. The presence of a magnetic field may cause the alkali vapor 26 to alter at least one measurable parameter (e.g. intensity) of the light passing therethrough. The reflected light along light path 22 is then captured by a detector configured to receive light from light path 22 and detect a magnetic field by analyzing the at least one measurable parameter.

Buffer gas 24 is optional, however, it may improve the sensitivity of magnetometer 10 and may be comprised of nitrogen, argon, neon, or methane, for example, and may be present at a desired pressure within enclosed volume 28. In order to allow for optimal operation of the magnetometer in the SERF regime, buffer gas pressures of several atmospheres may be desired. In an embodiment where a plurality of atomic magnetometers sensors 10 are used, in an array, advantageously they are filled simultaneously to provide uniformity of the cell parameters. Advantageously, a vacuum system configured for filling of the cell arrays with high pressures in a controlled way is used to fill each enclosed volume 28 in each magnetometer sensor 10.

The size and shape of magnetometer sensor 10 may be selected to optimize its sensitivity. Therefore, magnetometer sensor 10 may be cubic, spherical, or even egg shaped, for example. Magnetometer sensor 10 may be as small as 1 mm, or even smaller, and may be 10 mm, or even larger. In at least one embodiment, bottom wall 16 has a greater mass than top wall 12. In this embodiment, random placement of a plurality of atomic magnetometer sensors 10, forming an array of magnetometer sensors 10, on a surface provides an increase in the percentage of atomic magnetometers having top wall 12 facing upwardly.

Figure 2:
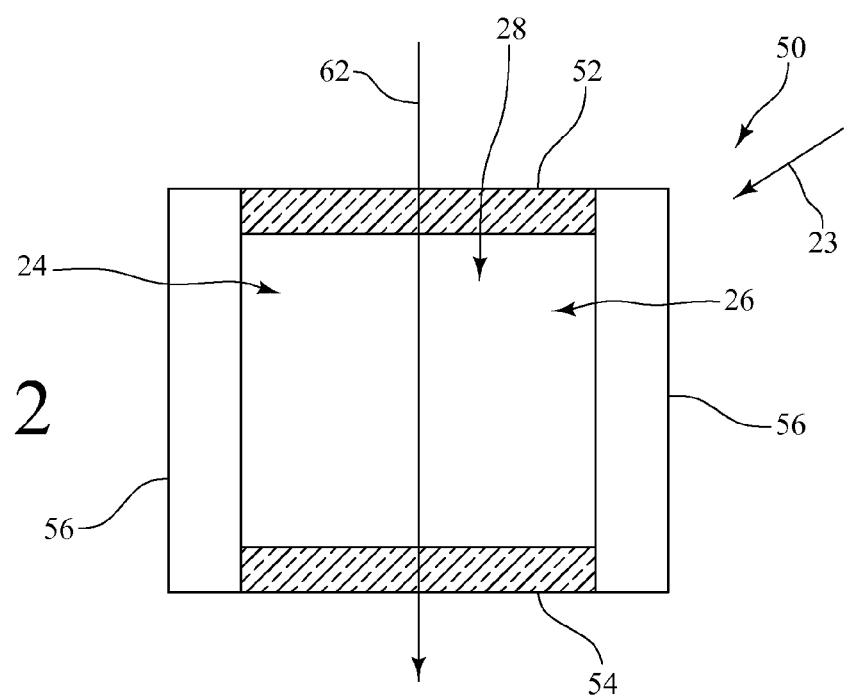
FIG. 2 is an illustration of an atomic magnetometer sensor having opposite transparent or translucent surfaces configured to operate in free space.

FIG. 2 shows another embodiment of an atomic magnetometer sensor that may operate in free space. Atomic magnetometer sensor 50 has transparent or translucent first wall 52 and transparent or translucent second wall 54 joined by side walls 56 to form enclosed volume 28. Side walls 56 may have reflective inner surfaces. Enclosed volume 28 has alkali vapor 26 contained therein. Optionally, one or more buffer gases 24 are also contained within enclosed volume 28. Laser light 62 is directed through free space, first wall 52, enclosed volume 28, and out of second wall 54. Laser light 62 may be used to heat atomic magnetometer sensor 50 or otherwise enhance the alkali vapor density inside the cell, by desorption for example, and to provide light 62 exiting second wall 54 for collection by a laser light detector, not shown. For example, laser light 62 may be emitted at varying or different frequencies wherein a portion of the energy is absorbed by first wall 52 and/or second wall 54, heating atomic magnetometer sensor 50 to a desired temperature. First wall 52 and/or second wall 54 may be comprised of colored glass configured to absorb light 62 within a selected wavelength range and to allow light to pass therethrough at another wavelength range. Alternatively or additionally, second laser light 23 may be directed toward a side wall 56 for heating atomic vapor sensor 50. Laser light 62 is directed through free space into atomic magnetometer sensor 50 along laser light path 62 wherein the light passes through alkali vapor 26. The presence of a magnetic field may cause the alkali vapor 26 to alter at least one measurable parameter of laser light 62 passing therethrough. The laser light 62 emitted from second wall 54 is directed through free space to be captured by a detector configured to receive light and detect a magnetic field interacting with alkali vapor 26 by analyzing the at least one measurable parameter of laser light 62.

Atomic magnetometer sensor 50 may provide highly precise, remote sensing of electromagnetic fields and possibly other environmental parameters of interest. First wall 52, second wall 54, and side walls 56 form an enclosure and may be comprised of low thermal conductivity materials. Advantageously, first wall 52, side walls 56, and second wall 54 are comprised of non metallic materials such as silica and glass. The sensor signal is monitored by illuminating the cell with light beam 62, which is transmitted through first wall 52, vapor 26, and second wall 54, to a measurer, through free space.

In one aspect of the present invention, first wall 52 and/or second wall 54 are comprised of glass or other transparent or translucent material configured to absorb heat when contacted with laser light at a first wavelength and to allow light at a second wavelength to pass therethrough. For example, first wall 52 and/or second wall 54 may contain or be coated with a material configured to have a high heat absorbing efficiency for light having a wavelength of about 980 nm and a high transmittance for light having a wavelength of about 795 nm, for example.

Figure 3:
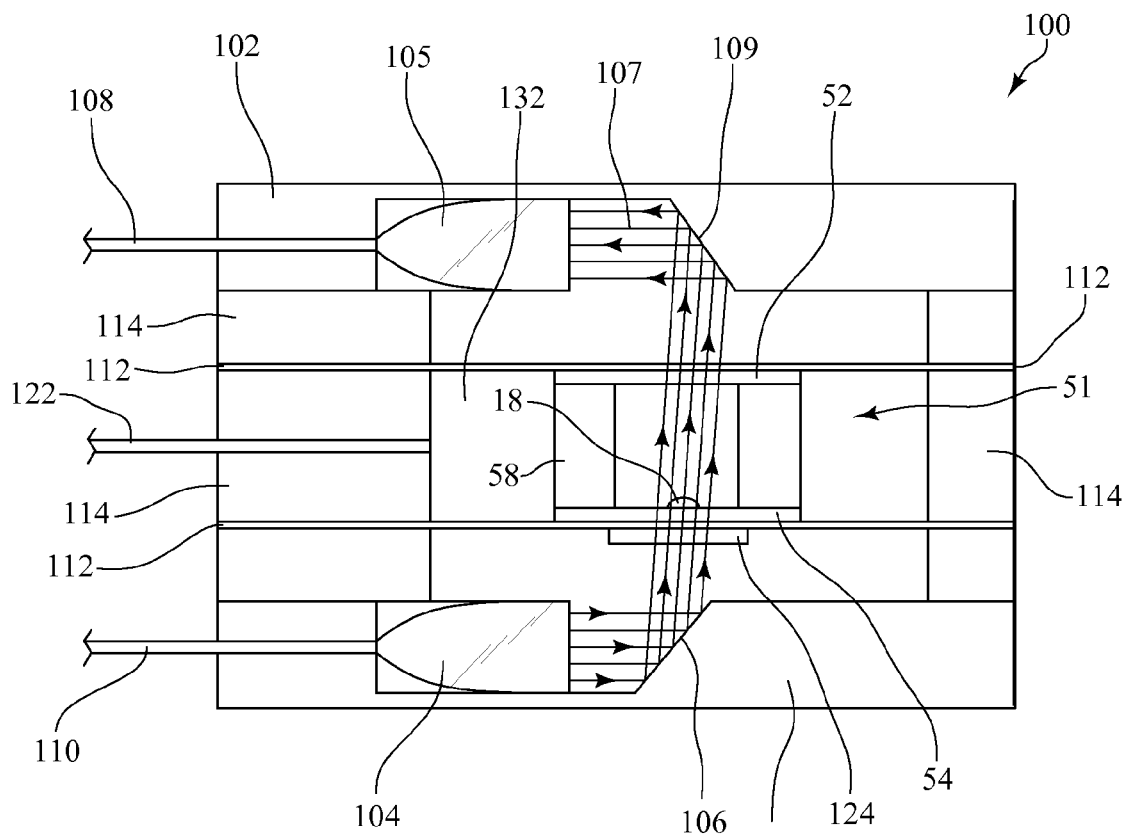
FIG. 3 is an illustration of an atomic magnetometer sensor head configured to be optically tethered to at least one laser and a detector.

FIG. 3 shows sensor head 100 having alkali vapor cell 51 contained therein. The optical system includes the interface between optical fiber systems and the sensor head 100. The light 107 transmitted though the cell 51 may contain the information about a magnetic field at the position of cell 100. Fiber 108 guides the light back to a remote location, not shown, for detection. Sensor head 100 is a part of a complete optical interrogation system for measuring magnetic fields.

A vapor cell 51 is integrated with the optical components of sensor head 100. Sensor head 100 is an embodiment of a fiber coupled chip scale atomic magnetometer or MEMS sensor head and contains an alkali atomic vapor cell 51. A first laser or heating laser, not shown, may transmit laser light into optic fiber 122 for heating atomic vapor cell 51. Advantageously, the first laser may transmit light between about 800 nm and about 1200 nm, or more advantageously about 985 nm. The laser light transmitted through optic fiber 122 passes through void space 132 and contacts side wall 58, of atomic vapor cell 51. Void space 132 may be under vacuum, increasing thermal insulation of atomic vapor cell 51. Side wall 58 may be comprised of a silica containing material or other material which may contain the alkali vapor and any buffer gas within atomic vapor cell 51, be inert to alkali vapor, and have little or no magnetic properties. The outer surface of side wall 58 heats in response to the contact of laser light from optic fiber 122. Advantageously, the outer surface of sidewall 58 is dark in color or has a coating for increasing the amount of heat transferred into atomic vapor cell 51 in response to the contact of laser light through optic fiber 122. The heat generated on the surface of side wall 58 is conducted into atomic vapor cell 51, heating alkali material 18. Alkali material 18 may be rubidium (e.g. $^{87}$Rb), cesium, potassium, or sodium, for example. Alkali-like materials such as metastable helium ($^4$He) may also be used in place of the alkali material. Advantageously, alkali material 18 is heated to between about 100° C. and 200° C., or more advantageously about 150° C. Upon heating, alkali material 18 evolves an alkali vapor within atomic vapor cell 51, where it is contained therein.

A second laser or interrogation laser, not shown, may transmit light between about 600 nm and about 1000 nm, or more advantageously about 795 nm, into sensor head 100 through optic fiber 110. Optic fiber 110 may be a polarization-maintaining single-mode optical fiber. The transmitted light may then be expanded and collimated with first micro-lens 104. First micro-lens 104 may be a gradient index (GRIN) lens. First reflecting surface 106, which may be in the form of a mirror, may then reflect the expanded and collimated light to a waveplate 124. Waveplate 124 may be in the form of a quarter waveplate which circularly polarizes the light. The polarized light then passes through the first translucent or transparent wall 54 of alkali atomic vapor cell 51. The polarized light then passes through the alkali vapor contained within cell 51 wherein at least one measurable parameter of the light may be altered in response to a magnetic field. The light then leaves atomic vapor cell 51 through the second translucent or transparent wall 52 of alkali atomic vapor cell 51. Second reflecting surface 109 reflects the light leaving atomic vapor cell 51 to second micro-lens 105. Second micro-lens 105 may be a GRIN lens and configured to collect the light leaving atomic vapor cell 51 and transmit the light to optic fiber 108. Optic fiber 108 may be a multi-mode fiber and configured to transmit the light to a detector, not shown.

Vapor cell 51 may be suspended in an enclosure. The enclosure may be comprised of walls 114 surrounding a perimeter of vapor cell 51, a first wall 102 having reflective surface 109, and a second wall 116 having reflective surface 106. Walls 114, first wall 102 and second wall 116 are joined at their edges to form the enclosure providing a void space 132 about vapor cell 51. An inner surface of walls 114, 102 and 116 may be coated with a reflective material. Tethers, web, or sheets of low thermally conductive material 112 (e.g. polyamide) may extend between walls 114 to support vapor cell 51 within void space 132.

Figure 4:
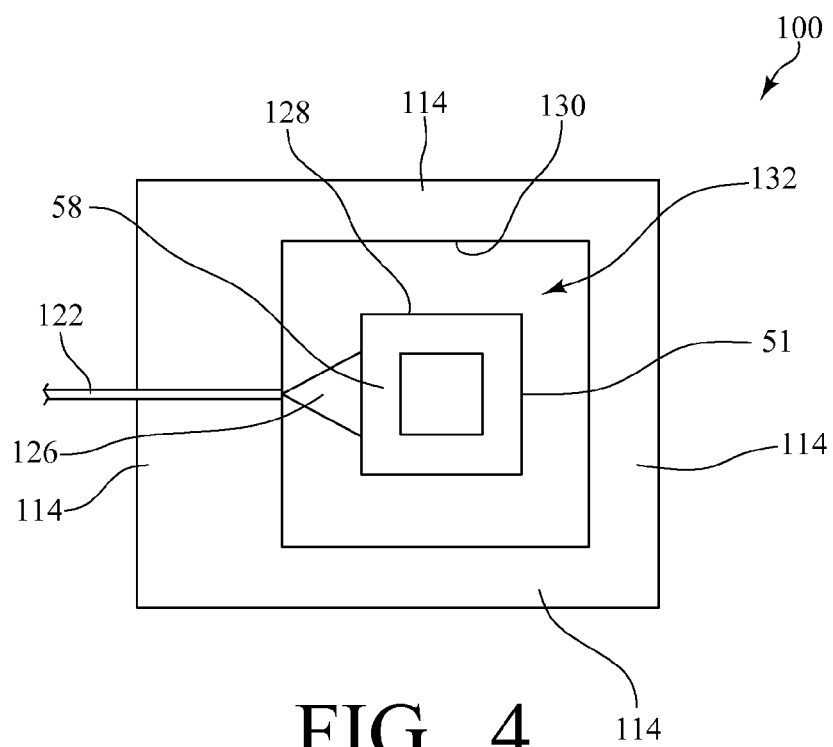
FIG. 4 is top cut-away view of an atomic magnetometer sensor head showing a laser heater.

FIG. 4 shows a heating and insulating system for MEMS sensor head 100. The heating system presently disclosed may provide for remote optical heating of vapor cell 51 with low power and low induced magnetic fields. Laser light, advantageously having a wavelength of about 980 nm, is coupled through optical fiber 122 to sensor head 100. Advantageously, wall 58 of vapor cell 51 has a high absorption for this wavelength of laser light. Wall 58 may be comprised of silicon and may be doped or otherwise have the outer surface of wall 58 coated with a heat absorbing material. Walls 114 form an enclosure about vapor cell 51 having enclosed volume 132. Advantageously, enclosed volume 132 is maintained under a vacuum, providing passive thermal insulation of vapor cell 51. Laser light 126 exits optic fiber 122, passes through the vacuum in enclosed volume 132, and contacts the outer surface of wall 58. An inner surface of walls 114 may be reflective or coated with a reflective material providing a surface to reflect radiant heat from vapor cell 51 to reflect back into vapor cell 51.

Vapor cell 51 may be heated to approximately 150° C., for example, with the optical absorption of laser light 126. The temperature of the atomic vapor within vapor cell 51 may be stabilized to within 0.1° C. In one embodiment, the temperature of vapor cell 51 may be detected by detecting a change in a parameter of laser light passing through vapor cell 51 and received by optic fiber 108, shown in FIG. 3. An active temperature stabilization system may include controlling laser light 126 in response to the laser detected temperature of vapor cell 51. For example, a servo may be used to control the power to a laser emitting laser light 126 to maintain a substantially constant alkali vapor density inside vapor cell 51.

FIG. 4 also shows an embodiment of the passive thermal insulation of vapor cell 51. Advantageously, vapor cell 51 (or the active sensor volumes in an array of vapor cells) are heated to a temperature around 150° C. with laser light 126 in order to raise the rubidium vapor density to the desired value. This may be done optically with light at about 980 nm. The body or walls 114 forming an enclosure about of the MEMS vapor cell 51 may be comprised of silicon. The windows 52 and 54, shown in FIG. 3, may be comprised of borosilicate glass. To increase the absorption of the heating light by these surfaces, a "black" coating may be applied to the cell sides or walls 58 and translucent or transparent walls 52 and 54 may have a "black" material configured to absorb heat from laser light passing therethrough.

The walls of the housing or inner surfaces of walls 114 may be coated with a highly reflecting material such as gold, for example, to minimize heat absorption by the enclosure or walls 114, 116, and 102. The temperature of the vapor may be sensed through the absorption of the atomic vapor, instead of having the electrical connections associated with electrical heating arrangements in the vicinity of the sensor.

The outer surface of side wall 58 heats in response to the contact of laser light from optic fiber 122. Advantageously, the outer surface of sidewall 58 is dark in color or has a coating for increasing the amount of heat transferred into atomic vapor cell 51 in response to the contact of laser light through optic fiber 122. The heat generated on the surface of side wall 58 is conducted into atomic vapor cell 51, heating alkali material 18.

Figure 5:
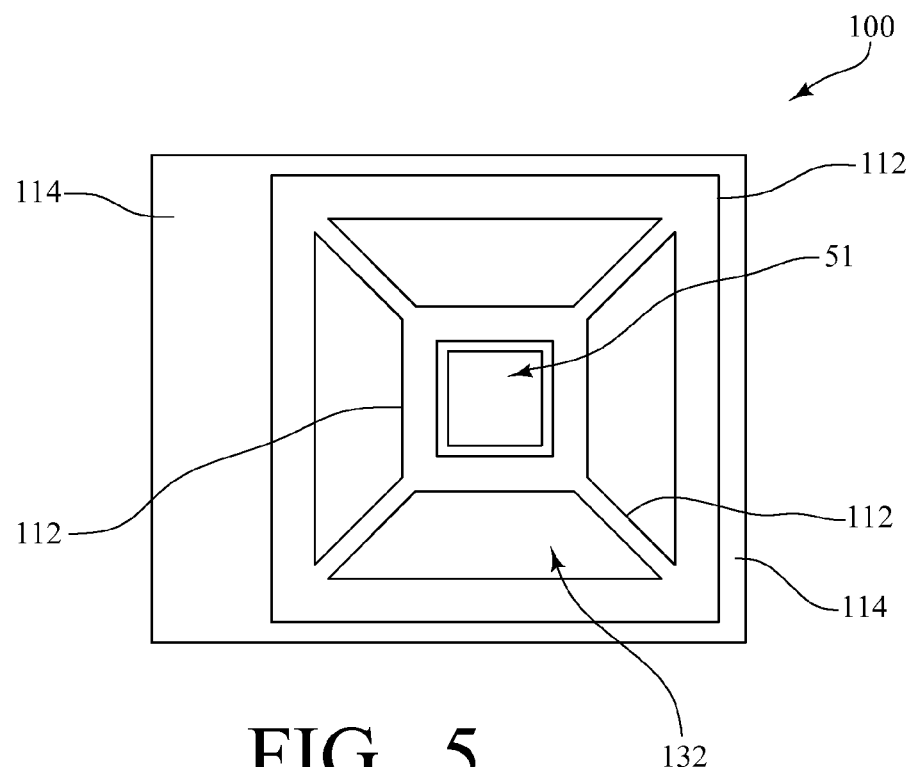
FIG. 5 is top cut-away view of an atomic magnetometer sensor head showing an insulating system.

FIG. 5 shows a means to minimize the power consumption and to stabilize the temperature of the atomic vapor cell 51. Atomic vapor cell 51 is thermally isolated from the environment by suspending vapor cell 51 with a web of low thermal conductivity material 112, such as polyimide tethers as shown. This thermal suspension system may minimize the conduction of heat between walls 114 and vapor cell 51. A highly reflective material on all or portions of the inner surface of the outer enclosure or walls 114, 102, and 116 may also serve to decrease radiant heat transfer, and at the same time may serve as a low absorptive coating for the light of the heating laser. Advantageously, enclosed volume 132 is evacuated to below 1 Torr, minimizing convective heat transfer between vapor cell 51 and walls 114. Vacuum getters may maintain a reasonably low pressure inside enclosed volume 132 over long time periods.

Figure 6:
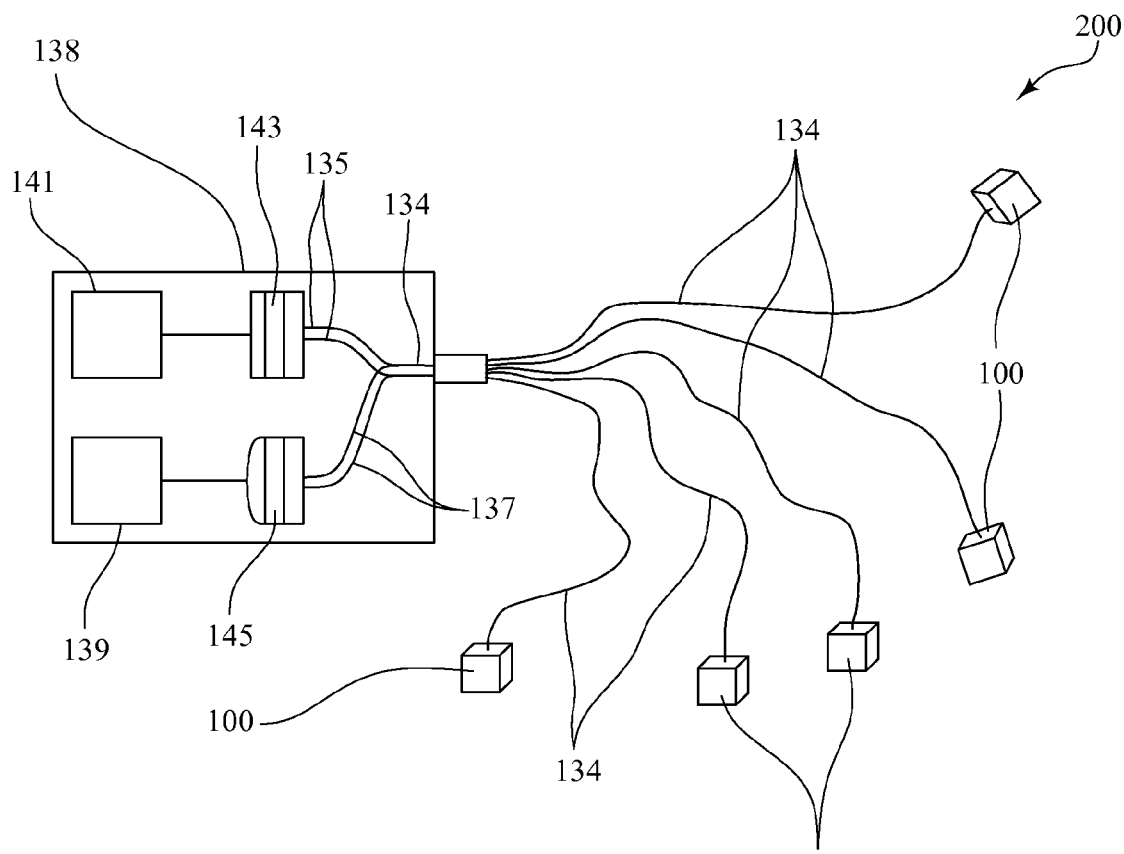
FIG. 6 is an illustration of an atomic magnetometer supply and detector unit having an array of sensor heads optically tethered to a laser and a detector.

FIG. 6 shows an overall design of a fiber-coupled CSAM array 200. CSAM array 200 comprises a flexible array of small MEMS atomic sensors 100. Each MEMS atomic sensor advantageously has a desired magnetic field sensitivity. A single heating laser in laser supply and control unit 138 may supply laser light to heat each MEMS atomic sensor 100. The power to the heating laser may be regulated through an array of variable attenuators. Each MEMS atomic sensor 100 may have a volume of less than 1 $cm^3$ and may be placed into an arbitrary geometry with independent orientations and positions. The MEMS atomic sensors 100 may be connected to supply and control unit 138 with a set of optical fibers 134. Advantageously, each MEMS atomic sensor 100 does not contain any magnetic parts or electrical connections. The MEMS atomic sensors 100 or CSAMs are advantageously vector sensors that are sensitive to magnetic fields in two orthogonal directions with high sensitivity. To maximize performance, the total magnetic field at the position of each MEMS atomic sensor 100 may not exceed 100 nT. When operated at high magnetic field, the MEMS atomic sensors can also be advantageously scalar sensors, whose reading is independent of sensor orientation with respect to the magnetic field. Each MEMS atomic sensor 100 advantageously has an active volume around 1 $mm^3$. The remaining volume of each MEMS atomic sensor 100 may be filled with thermal insulation, mechanical suspension, and optical components. The optical fiber sets 134, connecting each MEMS atomic sensor 100 to the laser supply and control unit 138, advantageously have a length of roughly 2 to 5 meters, for example, and supply the light for pumping of the atomic vapor, the output signal after probing the atoms, and heating the atomic vapor. An optic fiber set 134, connected to each MEMS sensor 100, may be comprised of a plurality of optic fibers. In this embodiment, no electrical or magnetic components are present inside each MEMS atomic sensor 100.

Each MEMS sensor 100 may contain a $^{87}$Rb vapor cell. The light from an interrogation laser 141, located in laser supply and control unit 138, advantageously provides laser light with a wavelength of about 795 nm. Advantageously, interrogation laser 141 is coupled to each MEMS sensor 100 through a polarization-maintaining single-mode optical fiber 135, a component of fiber set 134. The light emitted from interrogation laser 141 may be split to each fiber 135 with fiber coupler 143. Each MEMS sensor 100 may comprise a MEMS receiving port for a fiber set 134. The light transmitted through MEMS sensor 100 may be transmitted to laser supply and control unit 138 with a multi-mode fiber 137, a component of fiber set 134. The light transmitted through multi-mode fiber 137 is received by laser supply and control unit 138 for detection by a multi-element photo detector array 145 contained therein. Control unit 138 may have a processor 139 configured to control laser 141, store and/or transmit data gathered from multi-element photo detector array 145, and/or provide other control functionality to array 200.

One aspect of fiber-coupled CSAM array 200 comprises a portable apparatus configured to hold MEMS sensors 100 in a desired orientation and locations with respect to one another. For example, the portable apparatus may be configured to detect magnetic fields in remote areas or the portable apparatus may be a helmet that may be worn by a patient. Fiber-coupled CSAM array 200 does not need to have a steady supply of liquid nitrogen as the temperature of each MEMS sensor 100 may be controlled optically.

Having MEMS sensors 100 placed in a rigid configuration during measurements, so that their relative position to each other is constant, may provide a means for compensating for drifts in a compensating field and/or a means for compensating for fluctuating background magnetic fields. For example, having one MEMS sensor 100 within magnetic field being detected and having another MEMS sensor 100 outside of the magnetic field being detected, detecting only background magnetic field, enables the subtraction of the background magnetic field from the magnetic field being detected. In order to compensate the ambient field to values less than 10 nT, an earth field magnetometer, such as an Mx or Bell Bloom atomic magnetometer may be used. The compensation may be implemented either as a difference between sensor readings or by using the reading from one sensor to affect and stabilize the magnetic field through actuation using, for example, a compensation coil system placed around the sensors.

Having MEMS sensors 100 placed in a rigid configuration, with respect to one another, may allow for field maps of the object under test, where all MEMS sensors 100 detect the magnetic field at their location simultaneously. Not only may this embodiment enable temporal and spatial mapping, but also may provide suppression of common ambient magnetic field noise by running sensors in first or higher order gradiometer modes. For applications where a constant relative position of the sensors is necessary, the flexible array of sensor may be imbedded in a stationary receptacle matrix.

In one aspect of the instant disclosure, the supply and control unit 138 may contain a narrow-band single-mode diode laser 141 emitting light at about 795 nm, an interrogation laser, for pumping and probing of the rubidium atomic magnetization in each MEMS sensor 100. Each MEMS sensor 100 may be heated to a temperature, e.g. about 150° C., in order to raise the rubidium density to a desired pressure or partial pressure within a buffer gas. This may be done optically with light advantageously having a wavelength of about 980 nm. The light may be transported through a separate optical fiber in each fiber set 134 to each MEMS sensor 100.

Figure 7:
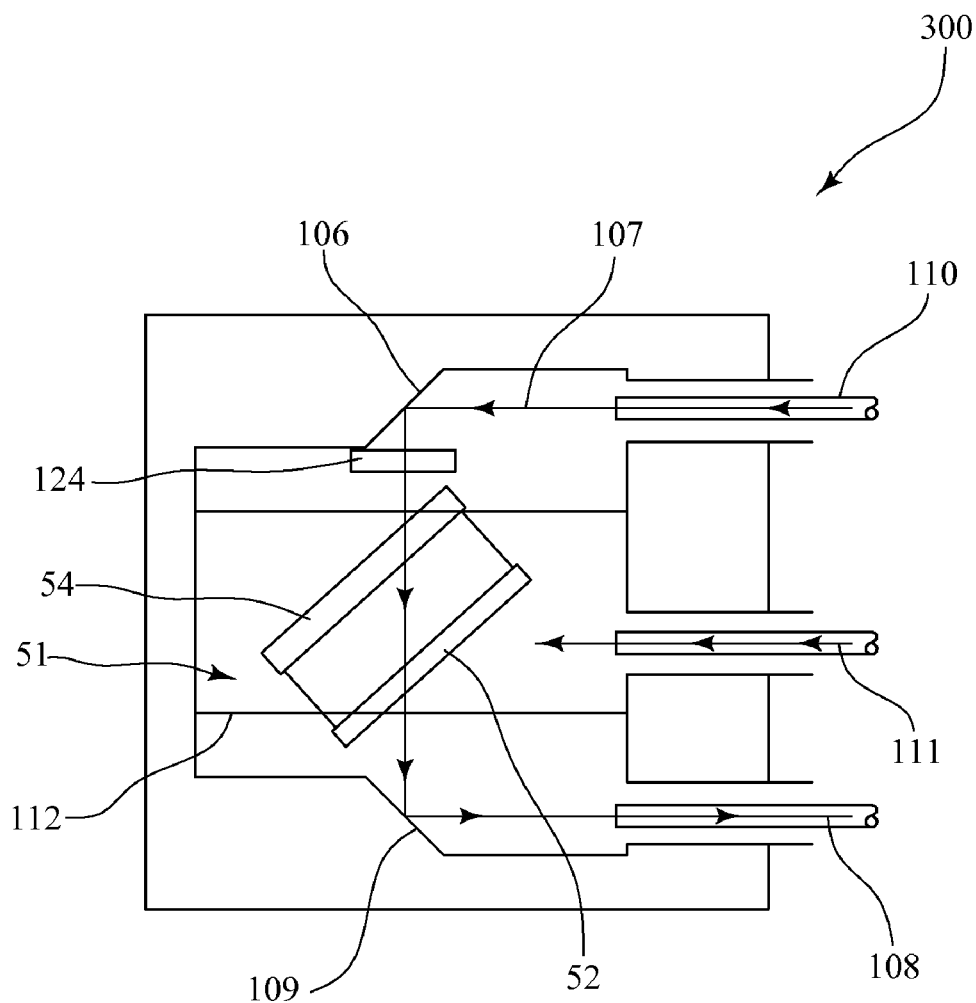
FIG. 7 is an illustration of a sensor having two laser beams, one pump beam and one probe beam.

FIG. 7 shows sensor head 300 having alkali vapor cell 51 contained therein. A first laser or interrogation laser, not shown, may transmit light into alkali vapor cell 51 through optic fiber 110 along light path 107. First reflecting surface 106, which may be in the form of a mirror, may then reflect the light to a waveplate 124. The polarized light then passes through the first translucent or transparent wall 54 of alkali atomic vapor cell 51. The polarized light then passes through the alkali vapor contained within cell 51 wherein at least one measurable parameter of the light may be altered in response to a magnetic field. The light then leaves atomic vapor cell 51 through the second translucent or transparent wall 52 of alkali atomic vapor cell 51. Second reflecting surface 109 reflects the light leaving atomic vapor cell 51 to optic fiber 108, as shown by light path 107. Fiber 108 guides the light back to a detector unit, not shown, for detection.

In the embodiment shown in FIG. 7, sensor head 300 has vapor cell 51 angled with respect to the light passing therethrough, as shown by light path 107, enabling a laser pump to direct light into vapor cell 51 through optic fiber 111. The light from the laser pump, not shown, may be directed to vapor cell 51 simultaneously with the transmission of light through optic fiber 110. The light transmitted through optic fiber 111 may have characteristics to cause the atomic spin of the atomic vapor within vapor cell 51 to horizontally align or orient, which may improve the performance of sensor head 300. Alternatively or additionally, a heating laser, not shown, may transmit laser light into optic fiber 111 for heating atomic vapor cell 51, prior to or in conjunction with the transmission of light into optic fiber 110. In this configuration, the light directed into vapor cell 51 through optic fiber 111 is not directly reflected to optic fiber 108. The light transmitted through optic fiber 110 passes through the cell 51, is reflected by a second mirror 107 and is collected by optic fiber 108 for transmission back to the detection region (not shown).

Figure 8:
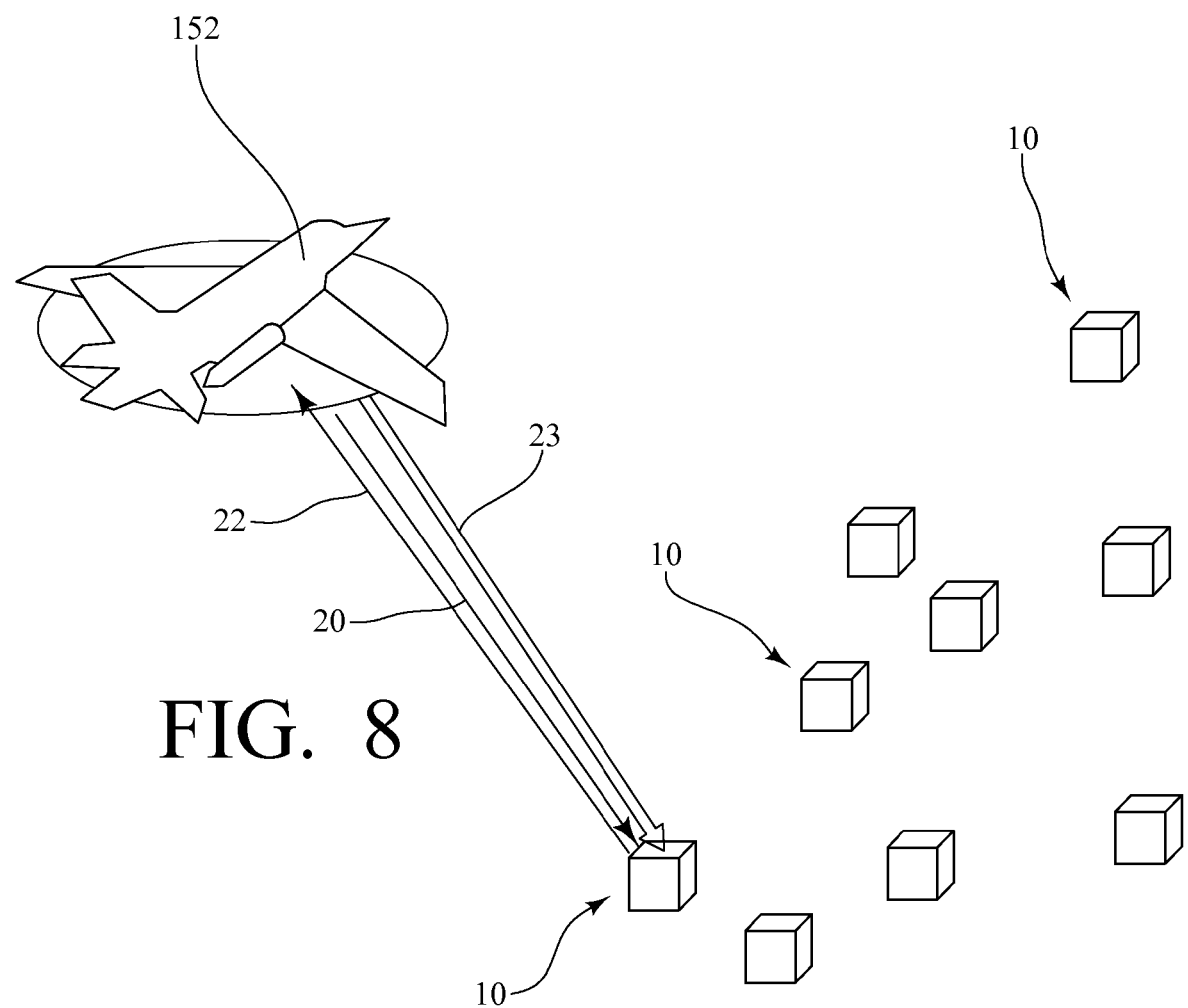
FIG. 8 is an illustration of an application of an array of atomic magnetometer sensors operating in free space.

FIG. 8 shows the remote detection of a magnetic field. An array of atomic sensors 10 are randomly placed on the ground for remote detection of an underground source of a magnetic field. Free space heating and probing of the all-optical magnetometers or sensors 10 is performed with an aircraft 152 passing over atomic sensors 10. A heating laser may heat sensors 10 with laser light 23. However, sensors 10 may be configured to operate at ambient temperature, eliminating the need to emit laser light 23. A probing laser onboard aircraft 152 or other installation with view of sensor 10 directs laser light 20 to the array of sensors 10. The laser light 20 propagates in free-space and passes through an upper transparent or translucent wall of sensors 10 wherein at least one measurable parameter of laser light is altered by the alkali vapor within sensor 10 in response to a magnetic field. Laser light 20 is reflected back to aircraft 152 along laser light path 22, with a lower reflective surface, e.g. micro corner cube reflector, in sensor 10. The laser light returning to aircraft 152 along laser light path 22 is received by a detector. The detector may receive a signal from a plurality of atomic sensors 10 in the array of sensors 10. The detected measurable parameter from each sensor 10 probed may be compared to subtract out any background magnetic field or other noise. This embodiment of the present invention allows for sensor head 10 to require no power and for the passive deployment of an array of sensors 10. The directed beam of laser light along light path 20 passes through free space and may be for only a short time period, during which the magnetic field at the sensor 10 location may be measured. Many sensors 10 may be deployed on the ground to form an array of sensors 10, and may remain deployed inactively over long periods of time until optically activated by illumination.

Figure 9:
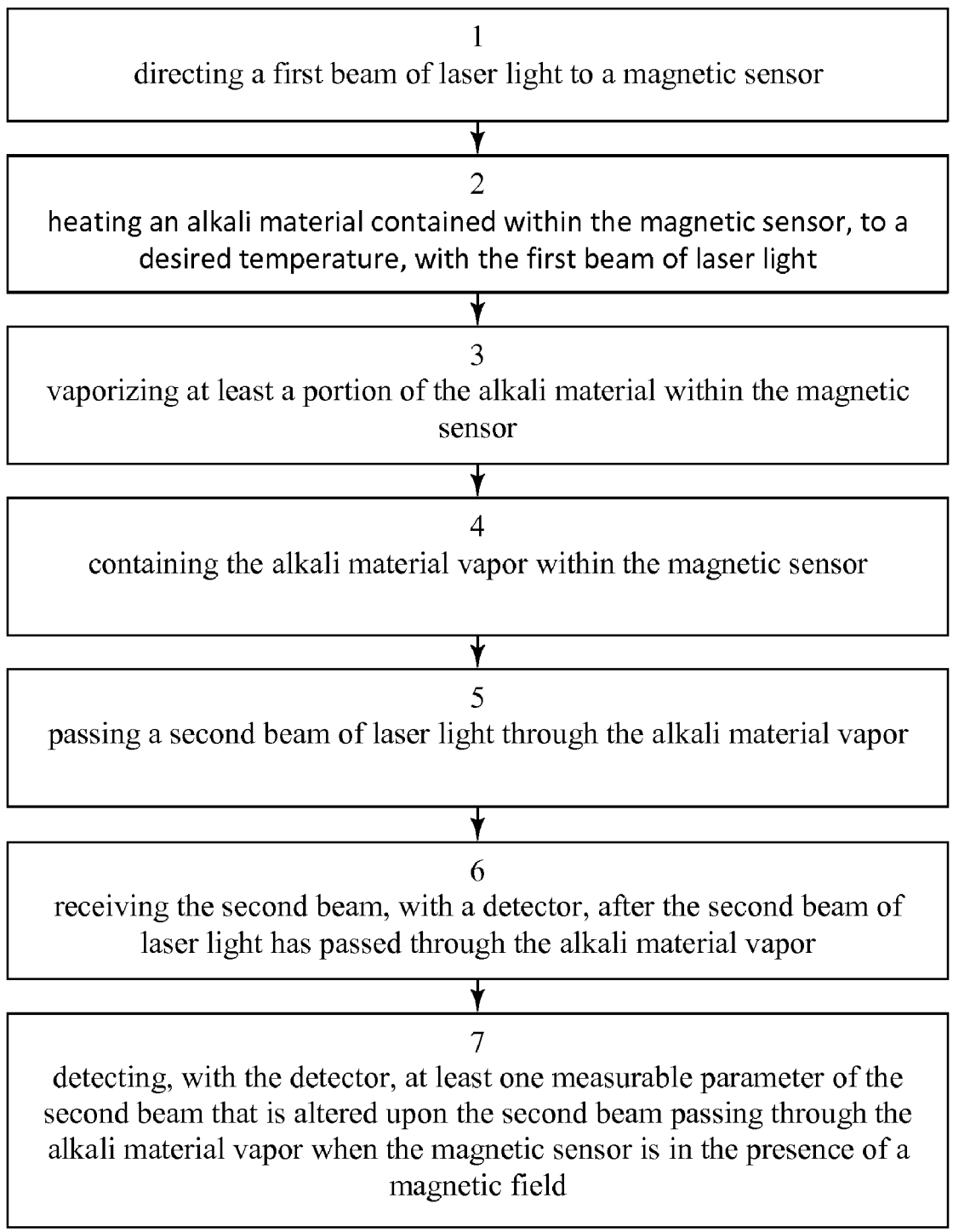
FIG. 9 is a flow diagram showing a method of detecting a magnetic field with an atomic magnetometer.

FIG. 9 shows a method for detecting a magnetic field. In step 1, a first beam of laser light is directed to a magnetic sensor. Advantageously, the first beam of laser light has a wavelength between about 900 nm and 1100 nm. In step 2, an alkali material contained within the magnetic sensor is heated to a desired temperature, advantageously between about 100° C. and 200° C., with the first beam of laser light. In step 3, a portion of the alkali material is vaporized within the magnetic sensor. In step 4, the alkali material vapor is contained within the magnetic sensor at a desired pressure or desired partial pressure when a buffer gas is present within the magnetic sensor. In step 5, a second beam of laser light is passed through the alkali material vapor contained within the magnetic sensor. Advantageously, the second beam of laser light has a wavelength between about 700 nm and 900 nm. In one aspect of the present invention, the first and second beams of laser light are the same. The second beam of laser may be passed directly through the sensor or be reflected by the sensor. In step 6, the second beam of laser light is received by a detector configured to detect at least measurable parameter of the light received from the sensor. In step 7, at least one measurable parameter of the received light (e.g. wavelength or intensity) that is altered by the atomic material vapor contained within the sensor when in a magnetic field, is detected.

In one aspect of the present invention, steps 2-5 are each carried out in an environment with low magnetic field and step 3 produces a high alkali material vapor density within the magnetic sensor, thereby suppressing spin-exchange collisions of the alkali material vapor.

In another aspect of the present invention, the frequency of amplitude of light field incident on the atomic sample is modulated.

In yet another aspect of the present invention, a method for controlling the temperature of the alkali material vapor is provided. The second beam of laser light, or a third beam having desired characteristics, is passed through the alkali material vapor and is directed to a control unit having a detector configured to detect the temperature of the alkali material vapor. The detected temperature is compared to a desired temperature and the first laser is activated and deactivated, with a servo, for example, to maintain the temperature of the alkali material vapor proximate the desired temperature.

Embodiments of the present invention provide miniature, fiber-coupled or free space all optical sensor heads that may enable highly precise, remote sensing of electromagnetic fields and maybe other environmental parameters of interest. The sensor head may be based on a small alkali vapor cell, suspended in an enclosure by a low thermal conductivity material. The cell may be activated or heated to its operating temperature with a laser beam, delivered to the cell either through one or more optical fibers or through free space. The sensor signal may be monitored by illuminating the cell with a second light beam, which is transmitted through the vapor and may be reflected towards a detector, either through another optical fiber or through free space.

The invention claimed is:

1. A magnetometer comprising:
at least one sensor comprising:
an alkali material;
an alkali vapor cell that is void of electrical contacts and void of electrically conducting pathways and configured to contain said alkali material and vapor of said alkali material and configured to heat said alkali material to a desired temperature with laser light, said alkali vapor cell comprising:
at least one translucent or transparent wall configured to allow laser light to pass therethrough;
at least one reflective, refractive or transmissive wall configured to reflect, refract or transmit at least a portion of laser light passing through said at least one translucent or transparent wall to a detector;
a material configured to interact with laser light and thereby heat said alkali material to a desired temperature and evolve a sufficient amount of alkali vapor from said alkali material, within said alkali vapor cell; and
said sufficient amount of alkali vapor being suitable to alter at least one measurable parameter of laser light in response to a magnetic field;
said magnetometer further comprising:
at least one laser configured to direct laser light into said alkali vapor cell through said at least one translucent or transparent wall; and
a detector configured to receive laser light after passing through said alkali vapor.

2. The magnetometer of claim 1 comprising a first laser and a second laser;
said first laser being configured to heat said material configured to interact with laser light by directing laser light onto said material, thereby absorbing laser light and thereby heating said alkali material; and
said second laser being configured to direct laser light into said alkali vapor cell through said at least one translucent or transparent wall.

3. The magnetometer of claim 1 comprising
a single laser configured to heat said material configured to interact with laser light by directing laser light onto said material, thereby absorbing laser light and heating said alkali material, and
the single laser being configured to direct laser light into said alkali vapor cell through said at least one translucent or transparent wall.

4. The magnetometer of claim 1 comprising
a first laser configured to desorb alkali atoms from a material surface and
a second laser being configured to direct laser light into said alkali vapor cell through said at least one translucent or transparent wall.

5. The magnetometer of claim 1 further comprising the limitations of a) or b):
a) wherein said at least one reflective, refractive or transmissive wall is configured to direct light emitted from said at least one laser toward a different location than a location of said at least one laser; and
wherein said at least one laser and said detector are positioned in different locations;
b) wherein said at least one reflective, refractive or transmissive wall is configured to direct light received from said at least one laser at a direction proximately opposite a direction of light emitted from said at least one laser; and
wherein said at least one laser and said detector are positioned in proximate locations.

6. The magnetometer of claim 1 wherein said at least one reflective, refractive or transmissive wall comprises at least one corner cube reflector.

7. The magnetometer of claim 1 wherein said alkali vapor cell further comprises:
at least one wall comprising said material configured to interact with laser light and configured to heat said alkali material to a desired temperature.

8. The magnetometer of claim 7 wherein said at least one wall comprising said material configured to interact with laser light comprises a coating of absorptive material.

9. The magnetometer of claim 1 wherein said at least one laser configured to direct laser light into said alkali vapor cell through said at least one translucent or transparent wall comprises a single laser configured to orient the atoms of said alkali vapor and provide said laser light emitted to said detector in order to measure the effects of the magnetic field on the atom orientation.

10. The magnetometer of claim 1 wherein said at least one laser configured to direct laser light into said alkali vapor cell through said at least one translucent or transparent wall comprises a first and a second laser;
said first laser being configured to orient or align the atoms of said alkali vapor;
said second laser being configured to provide said laser light toward said detector in order to measure the effects of the magnetic field on the atom orientation or the atom alignment.

11. The magnetometer of claim 1 comprising an array of said sensors wherein each sensor in said array of sensors is positioned at a different location, each sensor in said array of sensors is configured to substantially simultaneously measure said magnetic field, while providing data for at least one of a), b), and c):
a) identifying the location of a source of said magnetic field;
b) removing the effects of a spatially uniform but time varying magnetic field; and
c) removing the effects of higher order spatial nonuniformities of the magnetic field which vary in time.

12. The magnetometer of claim 1 wherein said at least one translucent or transparent wall is a wavelength-dependent optical filter comprising said material configured to interact with laser light and configured to heat said alkali material to a desired temperature.

13. The magnetometer of claim 1 wherein said sensor is fabricated using micromachining processes.

14. A method for detecting a magnetic field comprising the steps of:
directing a first beam of laser light to a magnetic sensor;
heating an alkali material, contained within said magnetic sensor, to a desired temperature with said first beam of laser light;
vaporizing at least a portion of said alkali material within said magnetic sensor at the desired temperature;
containing said alkali material vapor within said magnetic sensor;
passing a second beam of laser light through said alkali material vapor;
receiving said second beam, with a detector, after said second beam of laser light has passed through said alkali material vapor; and
detecting, with said detector, at least one measurable parameter of said second beam that is altered upon said second beam passing through said alkali material vapor when said magnetic sensor is in the presence of a magnetic field.

15. The method for detecting a magnetic field of claim 14 wherein said steps of heating an alkali material; vaporizing at least a portion of said alkali material within said magnetic sensor; containing said alkali material vapor within said magnetic sensor; and passing a second beam of laser light through said alkali material vapor are each carried out in an environment with a magnetic field being present and said step of vaporizing at least a portion of said alkali material within said magnetic sensor produces an alkali material vapor density within said magnetic sensor which suppresses spin-exchange collisions of the alkali material vapor.

16. The method for detecting a magnetic field of claim 14 wherein measuring a precession of the alkali atoms about a static magnetic field is accomplished through a modulation of the frequency of amplitude of the laser light incident on an atomic sample during said step of passing a second beam of laser light through said alkali material vapor.

17. A magnetometer comprising:
at least one sensor head that is void of any electrical contacts, void of any electrically conducting pathways, and extraneous metallic components, said at least one sensor head comprising:
an alkali material;
an alkali vapor cell containing said alkali material and vapor of said alkali material:
said alkali vapor cell comprising a material configured to heat said alkali material contained therein to a desired temperature with laser light in order to vaporize a portion of said alkali material upon the application of laser light onto or through an outer surface thereof; and
an enclosure configured to substantially enclose and insulate said alkali vapor cell; and
an alkali vapor cell support, comprising a low thermal conductive material, configured to support said alkali vapor cell within said enclosure wherein a void space is between said outer surface of said alkali vapor cell and said enclosure;
said magnetometer further comprising:
a first optic fiber comprising a first end in light communication with said alkali vapor cell;
a laser in light communication with a second end of said first optic fiber;
a second optic fiber having a first end in light communication with said alkali vapor cell; and
an optical detector in light communication with a second end of said second optic fiber, said optical detector being configured to detect at least one measurable parameter of laser light that is altered upon passing through said sensor head when in the presence of a magnetic field.

18. The magnetometer of claim 17 further comprising
one or more lenses configured to collimate or refocus light emitted from said alkali vapor cell and
transmit said collimated or refocused light into said first end of said second optic fiber.

19. The magnetometer of claim 17 further comprising the limitation of a) or b);
a) wherein said first optic fiber is a polarization-maintaining fiber;
b) wherein said first or second optic fiber is a multi-mode fiber.

20. The magnetometer of claim 17 wherein said first optic fiber is configured to direct light of different wavelengths toward said alkali vapor cell, said alkali vapor cell further comprising:
a wavelength-dependent optical filter configured to receive light transmitted thereto through said first optic fiber, and said wavelength-dependent optical filter further comprises:
said material configured to heat said alkali material contained therein.

* * * * *